(12) United States Patent
Kurosaki et al.

(10) Patent No.: US 9,867,307 B2
(45) Date of Patent: Jan. 9, 2018

(54) INFORMATION PROCESSING APPARATUS

(71) Applicant: FUJITSU LIMITED, Kawasaki-shi, Kanagawa (JP)

(72) Inventors: Keitaro Kurosaki, Kawasaki (JP); Kazunori Hori, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/298,684

(22) Filed: Oct. 20, 2016

(65) Prior Publication Data
US 2017/0135242 A1 May 11, 2017

(30) Foreign Application Priority Data
Nov. 10, 2015 (JP) .................................. 2015-220611

(51) Int. Cl.
*H05K 7/14* (2006.01)
(52) U.S. Cl.
CPC ......... *H05K 7/1487* (2013.01); *H05K 7/1489* (2013.01)
(58) Field of Classification Search
None
See application file for complete search history.

(56) References Cited

U.S. PATENT DOCUMENTS

| | | | | |
|---|---|---|---|---|
| 4,336,569 A | * | 6/1982 | Tsuda | F24C 7/082 219/702 |
| 4,864,469 A | * | 9/1989 | Boudon | G06F 1/183 361/679.43 |
| 5,045,971 A | * | 9/1991 | Ono | H04B 1/034 361/704 |
| 5,136,466 A | | 8/1992 | Remise et al. | |
| 5,224,024 A | * | 6/1993 | Tu | G06F 1/184 361/831 |
| 5,306,079 A | * | 4/1994 | Liu | G06F 1/183 312/223.2 |
| 5,715,139 A | * | 2/1998 | Nakajima | G06F 1/1616 361/679.55 |

(Continued)

FOREIGN PATENT DOCUMENTS

| | | |
|---|---|---|
| JP | 03-165095 A | 7/1991 |
| JP | 2008-251067 A | 10/2008 |
| JP | 2013-008339 A | 1/2013 |

*Primary Examiner* — Xanthia C Cunningham
(74) *Attorney, Agent, or Firm* — Squire Patton Boggs (US) LLP

(57) ABSTRACT

An information processing apparatus includes a lower unit having a circuit board on which first electronic components are mounted and also having a chassis in which the circuit board is mounted at a bottom, an upper surface of the chassis being open; and an upper unit having a tray member detachably attached to the chassis and also having second electronic components mounted at a bottom of the tray member, the upper unit being stacked on the lower unit; wherein the upper unit has a connector board attached to the tray member, having a first and a second connectors, the first connector being fitted to a board-side connector on the circuit board, the second connector being electrically connected to the second electronic components, and an opening is formed at the bottom of the tray member, the first connector and the board-side connector being mutually fitted through the opening.

10 Claims, 14 Drawing Sheets

(56) References Cited

U.S. PATENT DOCUMENTS

| | | | | |
|---|---|---|---|---|
| 6,172,867 | B1* | 1/2001 | Satou | G06F 1/1616 |
| | | | | 312/223.1 |
| 6,222,725 | B1* | 4/2001 | Jo | G06F 1/181 |
| | | | | 312/223.2 |
| 6,388,876 | B1* | 5/2002 | Chen | G06F 1/184 |
| | | | | 312/223.2 |
| 7,258,569 | B1* | 8/2007 | Johnson | H01R 13/6315 |
| | | | | 439/374 |
| 8,238,096 | B2* | 8/2012 | Zhen | G06F 1/187 |
| | | | | 312/223.1 |
| 2007/0297158 | A1* | 12/2007 | Lee | G06F 1/184 |
| | | | | 361/790 |
| 2008/0239656 | A1 | 10/2008 | Sasagawa et al. | |
| 2011/0292589 | A1* | 12/2011 | Yang | G06F 1/183 |
| | | | | 361/679.32 |
| 2012/0262876 | A1* | 10/2012 | Hensley | H05K 7/1487 |
| | | | | 361/690 |
| 2012/0293944 | A1* | 11/2012 | Yi | H05K 7/1487 |
| | | | | 361/679.32 |
| 2014/0008313 | A1* | 1/2014 | Chen | H05K 7/18 |
| | | | | 211/26 |
| 2015/0103492 | A1* | 4/2015 | Wu | G06F 1/185 |
| | | | | 361/726 |
| 2015/0163964 | A1* | 6/2015 | Lam | G06F 1/187 |
| | | | | 361/679.31 |
| 2016/0154440 | A1* | 6/2016 | Ni | H05K 7/1489 |
| | | | | 361/679.58 |
| 2016/0278231 | A1* | 9/2016 | Tsai | H05K 7/1487 |
| 2017/0215296 | A1* | 7/2017 | Tsai | H05K 7/1487 |

\* cited by examiner

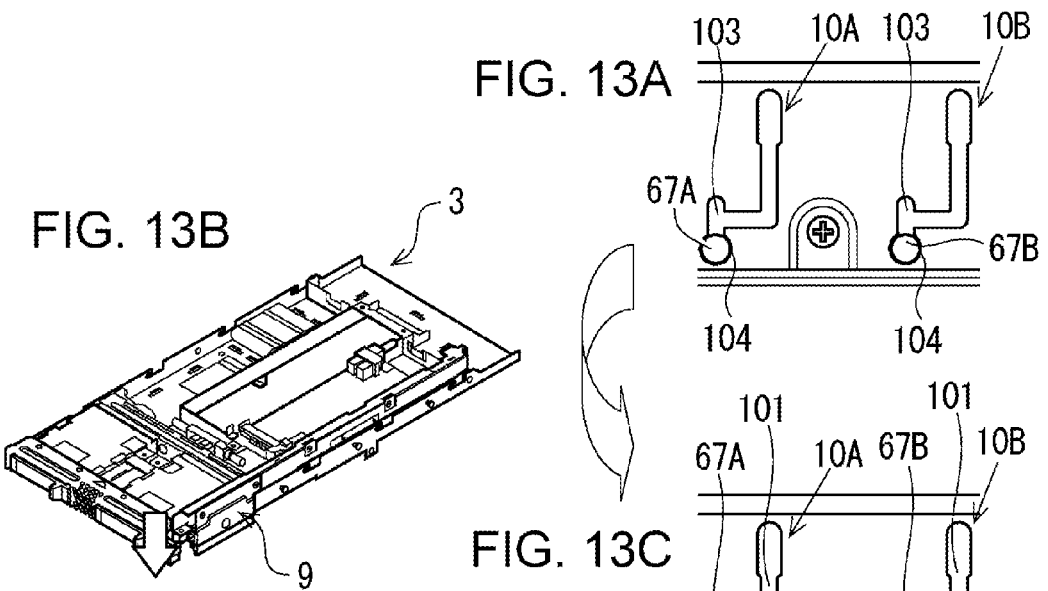
FIG. 13A
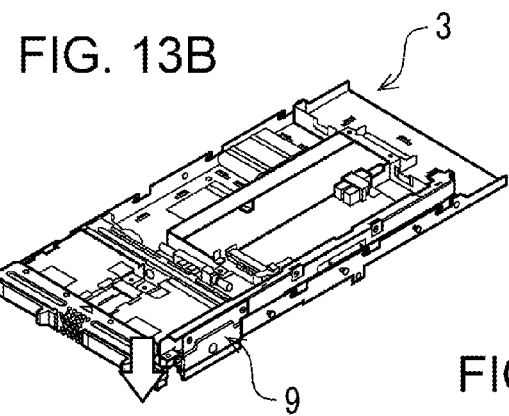
FIG. 13B
FIG. 13C
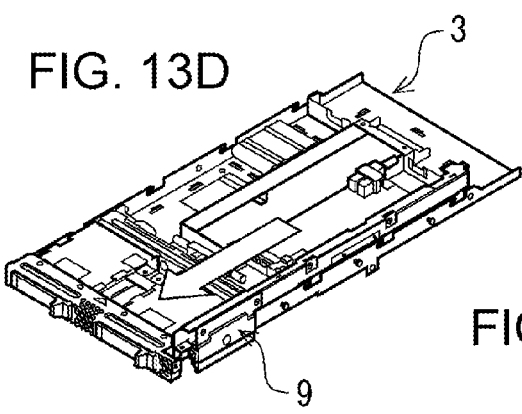
FIG. 13D
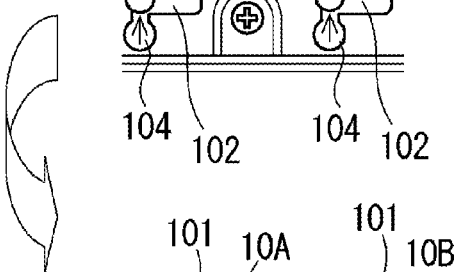
FIG. 13E
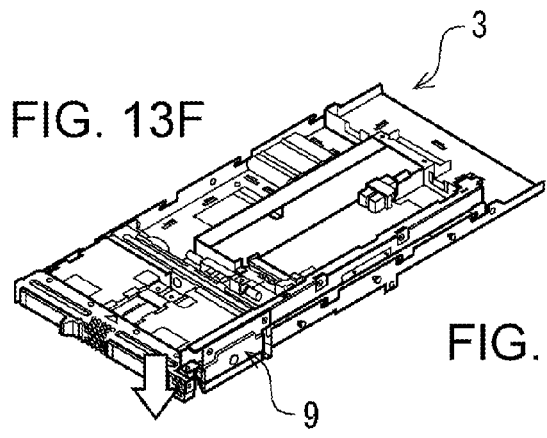
FIG. 13F
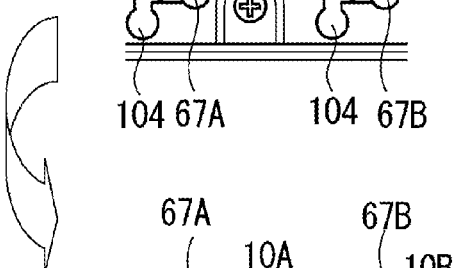
FIG. 13G
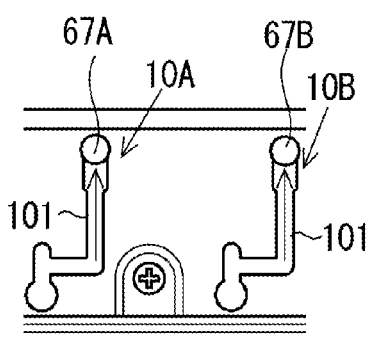

INFORMATION PROCESSING APPARATUS

CROSS-REFERENCE TO RELATED APPLICATION

This application is based upon and claims the benefit of priority of the prior Japanese Patent Application No. 2015-220611, filed on Nov. 10, 2015, the entire contents of which are incorporated herein by reference.

FIELD

The embodiment discussed herein is related to an information processing apparatus.

BACKGROUND

Due to the widespread use of the cloud technology and the compactness of apparatuses, a known server apparatus achieves server functions on a per-unit basis by mounting a central processing unit (CPU), a dual inline memory module (DIMM), a hard disk drive (HDD), a peripheral component interconnect (PCI) card, and other components in a single unit. This type of server apparatus in an aspect is an apparatus in which a main board (motherboard) on which electronic components are mounted is accommodated in a chassis.

In addition to a CPU, a DIMM, and other main components, an HDD, a PCI card, and other I/O components are often mounted on the main board. In this case, the main board has been expected to have a fixed area in which I/O components are mounted, an area in which connectors are disposed, an area in which an alignment mechanism that helps fitting between connectors on the main board and I/O components is disposed, a work area used to attach and detach I/O components, and other areas.

Related techniques are disclosed in, for example, Japanese Laid-open Patent Publication Nos. H03-165095, 2013-008339 and 2008-251067.

In the past practice, in which electronic components involved are mounted on a main board, therefore, a large circuit board has been desirable, so there has been a case in which a high density is impaired in a server apparatus. The present disclosure addresses the above problem with the object of providing an information processing apparatus that can be made compact and can have a high density.

SUMMARY

According to an aspect of the invention, an information processing apparatus includes a lower unit having a circuit board on which first electronic components are mounted and also having a chassis in which the circuit board is mounted at a bottom, an upper surface of the chassis being open; and an upper unit having a tray member detachably attached to the chassis and also having second electronic components mounted at a bottom of the tray member, the upper unit being stacked on the lower unit; wherein the upper unit has a connector board attached to the tray member, having a first and a second connectors, the first connector being fitted to a board-side connector on the circuit board, the second connector being electrically connected to the second electronic components, and an opening is formed at the bottom of the tray member, the first connector and the board-side connector being mutually fitted through the opening.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 13A to 13G illustrate a procedure for manipulating the riser card holding member in the embodiment as well as the relative positions of guide pins in alignment slits, the relative positions corresponding to the manipulation of the riser card holding member.

DESCRIPTION OF EMBODIMENT

An embodiment of an information processing apparatus will be described below with reference to the drawings.

Embodiment

Figure 1:
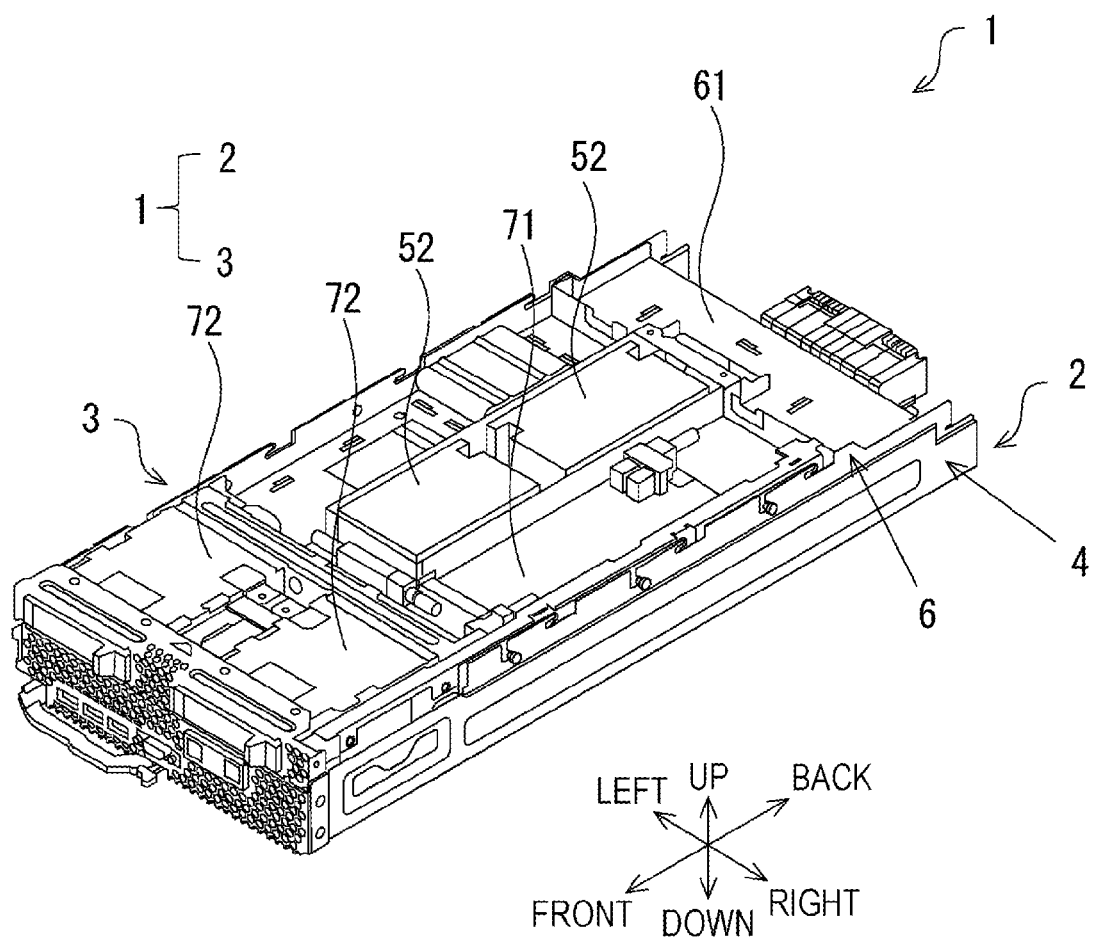
FIG. 1 is a perspective view of a server apparatus in an embodiment.

FIG. 1 is a perspective view of a server apparatus 1 in an embodiment. The server apparatus 1 is an example of an information processing apparatus. The server apparatus 1 includes a lower unit 2 and an upper unit 3, which is detachably stacked on the lower unit 2. The server apparatus 1 illustrated in FIG. 1 is in a state in which the upper unit 3 is attached on the top of the lower unit 2. Directions (up, down, front, back, left, and right) of the server apparatus 1 are defined in FIG. 1.

Figure 2:
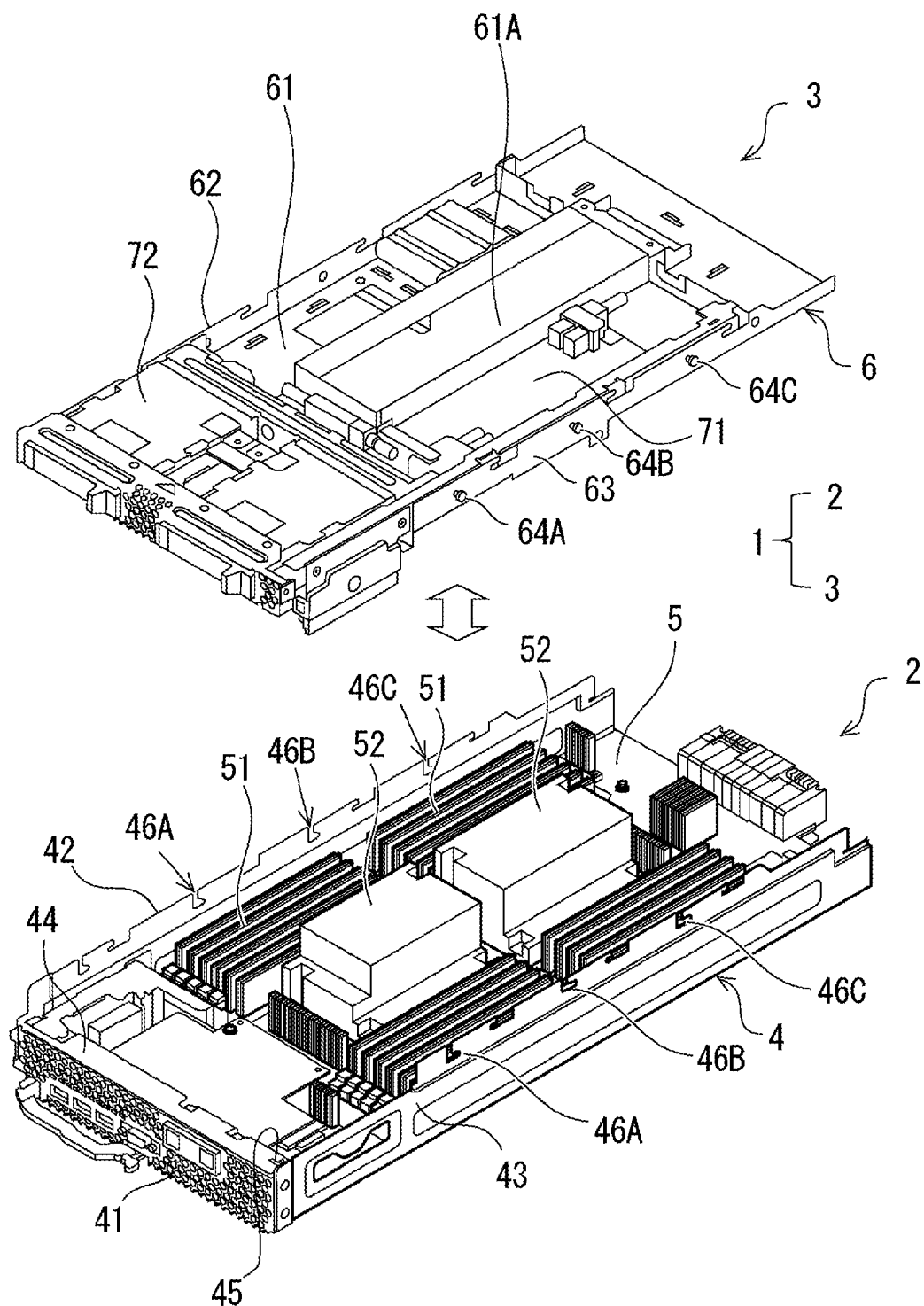
FIG. 2 illustrates a state in which the lower unit and upper unit of the server apparatus in the embodiment are separated from each other.

FIG. 2 illustrates a state in which the lower unit 2 and upper unit 3 of the server apparatus 1 in the embodiment are separated from each other. The lower unit 2 has a chassis 4, which is a housing frame, and a main board 5 mounted on the chassis 4. The main board 5 is a circuit board, which is also referred to as the motherboard. In this embodiment, one or a plurality of first electronic components are mounted on the main board 5. Specifically, a dual inline memory module (DIMM) 51, a central processing unit (CPU), which is not illustrated, and other components are mounted on the main board 5. Heat sinks 52 are attached on the CPU. Although the heat sinks 52 are schematically illustrated in FIGS. 1 and 2 and other drawings, heat radiating fins may be provided on the surfaces of each heat sink 52 in practice. The DIMM 51, the CPU, and other components mounted on the main board 5 are each an example of the first electronic component.

The main board 5 is mounted on the bottom 4A (see FIG. 8) of the chassis 4. The chassis 4 has erected walls 41, 42, and 43, which are erected perpendicularly in the upward direction from the bottom on which the main board 5 is mounted. The back of the chassis 4 is open. Now, the erected wall 41 positioned at the front of the chassis 4 will be referred to below as the forward erected wall 41, the erected wall 42 positioned on the left side of the chassis 4 will be referred to below as the left erected wall 42, and the erected wall 43 positioned on the right side of the chassis 4 will be referred to below as the right erected wall 43. As illustrated in FIG. 2, the left erected wall 42 and right erected wall 43 are oppositely disposed, and the forward erected wall 41 is linked to the left erected wall 42 and right erected wall 43.

As illustrated in FIG. 2, a flange 44, which extends along the width of the forward erected wall 41, is provided at the upper edge of the forward erected wall 41 of the chassis 4 so as to protrude. Specifically, the flange 44 protrudes from the upper edge of the forward erected wall 41 toward the inside of the chassis 4, that is, toward its space in which the main board 5 is accommodated. A rectangular chassis-side engaging slit 45 is formed in a portion of the flange 44, the portion being close to the right erected wall 43, so as to pass through the flange 44 in its thickness direction. Although, in this embodiment, the chassis-side engaging slit 45 is in a rectangular shape, there is no particular limitation on the shape of the chassis-side engaging slit 45. The chassis-side engaging slit 45 is an example of a first through-hole. The chassis-side engaging slit 45 will be described later in detail. As illustrated in FIG. 2, the left erected wall 42 and right erected wall 43 of the chassis 4 each have attachment and detachment slits 46A, 46B, and 46C, which are L-shaped. The attachment and detachment slits 46A, 46B, and 46C will be described below in detail.

Figure 3:
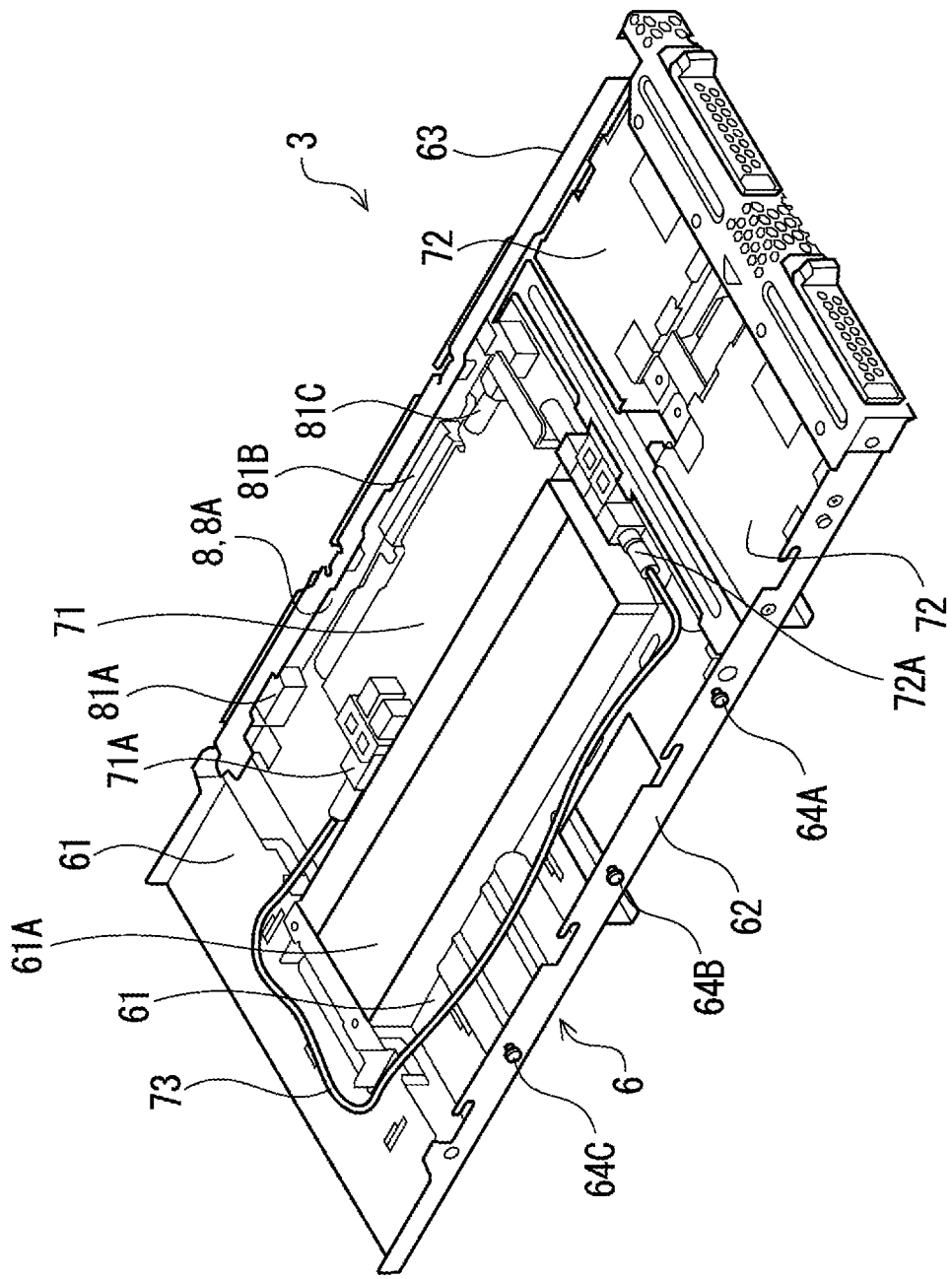
FIG. 3 is a perspective view of the upper unit in the embodiment.

Next, the upper unit 3 will be described. FIG. 3 is a perspective view of the upper unit 3 in the embodiment when viewed from a direction different from FIG. 2. As illustrated in FIGS. 2 and 3, the upper unit 3 has a tray member 6, which is detachably attached to the chassis 4, one or a plurality of second electronic components mounted on the tray bottom 61 of the tray member 6, and other components. A peripheral component interconnect (PCI) card 71, a hard disk drive (HDD) 72, and other I/O components (input/output electronic components) are mounted on the tray member 6 in this embodiment. The PCI card 71, which is a so-called expansion card, may be, for example, a network card, a small computer system interface (SCSI) card, a sound card, or another card. In this embodiment, the PCI card 71 and HDD 72 are each an example of the second electronic component.

An opening 61A is formed near the center of the tray bottom 61 of the tray member 6. The opening 61A suppresses the heat sinks 52 mounted on the main board 5 from interfering with the tray bottom 61 of the tray member 6 when the upper unit 3 is attached on the lower unit 2 by being stacked on it, as illustrated in FIG. 1.

The tray member 6 of the upper unit 3 has two tray walls, a tray left wall 62 and a tray right wall 63, which are erected perpendicularly in the upward direction from the tray bottom 61. The tray left wall 62 and tray right wall 63 are each an example of a tray side wall. Each of the tray left wall 62 and tray right wall 63 has engaging pins 64A, 64B, and 64C, which protrude laterally, on its outer surface. The engaging pins 64A, 64B, and 64C disposed on the tray left wall 62 and tray right wall 63 can engage attachment and detachment slits 46A, 46B, and 46C formed in the left erected wall 42 and right erected wall 43 of the chassis 4. When the engaging pins 64A, 64B, and 64C of the tray member 6 are inserted into the attachment and detachment slits 46A, 46B, and 46C formed in the chassis 4, the tray member 6 can be attached to the chassis 4. When the engaging pins 64A, 64B, and 64C are removed from the attachment and detachment slits 46A, 46B, and 46C, the tray member 6 can be detached from the chassis 4.

Figure 4:
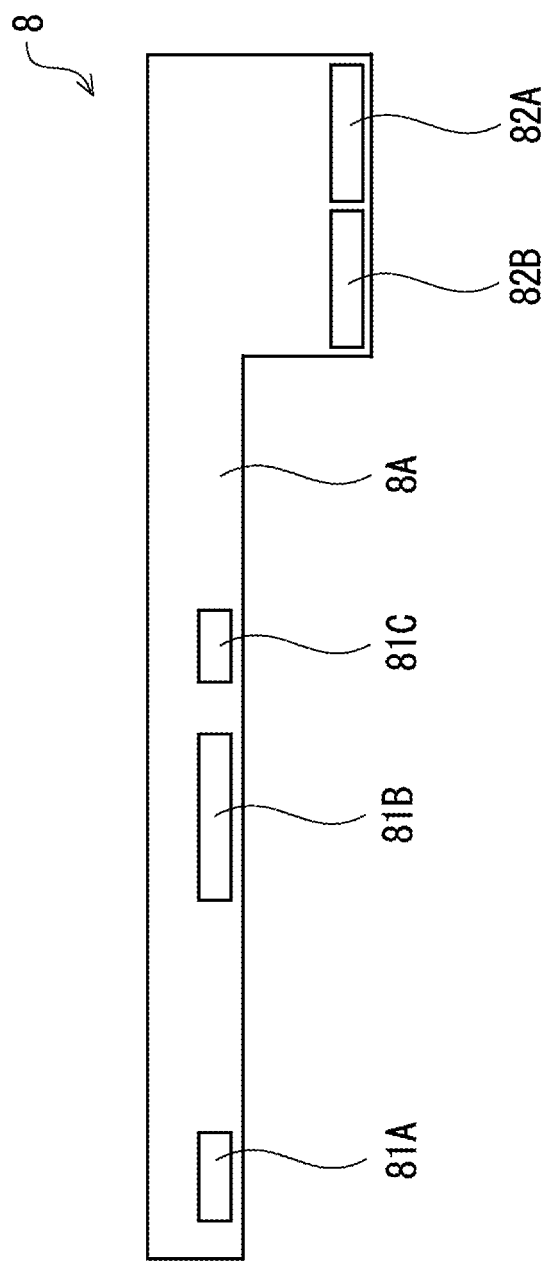
FIG. 4 schematically illustrates the connector attachment surface of a riser card in the embodiment.

In the upper unit 3, the connector 72A of the HDD 72 is connected to the connector 71A of the PCI card 71 through a flexible cable 73. The flexible cable 73 is illustrated only in FIG. 3. As illustrated in FIG. 3, a riser card (riser board) 8 is provided inside the tray right wall 63 of the upper unit 3 (specifically, the tray member 6) as an example of a connector board. FIG. 4 schematically illustrates the connector attachment surface 8A of the riser card 8 in the embodiment. The riser card 8 is a small semiconductor board perpendicularly attached to the main board 5 to add functions to it. The riser card 8 is also referred to as the daughter board. The riser card 8 is disposed so that the connector attachment surface 8A faces the inside of the accommodating space in the upper unit 3.

Figure 5:
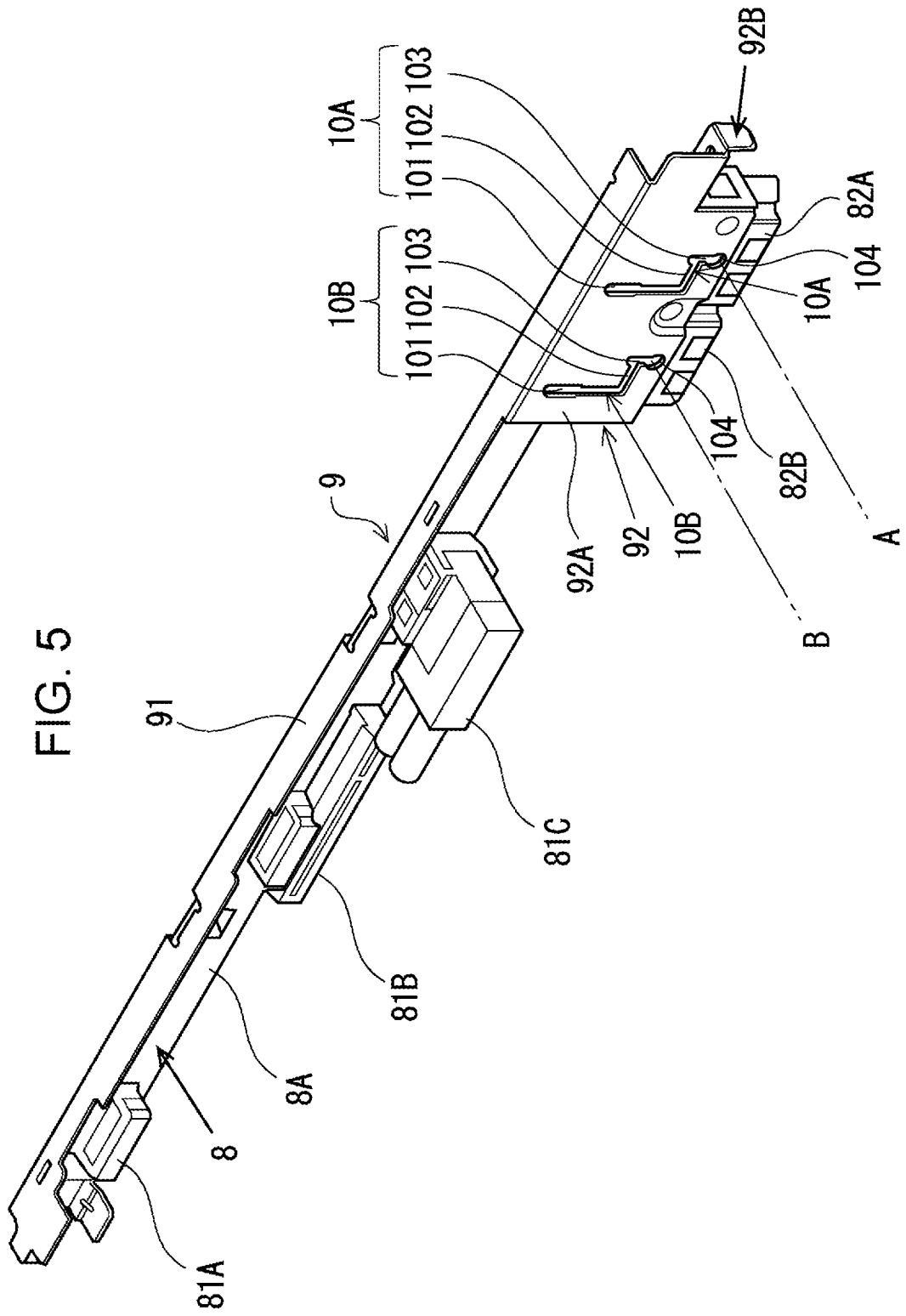
FIG. 5 illustrates a state in which the riser card is held to a riser card holding member in the embodiment.

FIG. 5 illustrates a state in which the riser card 8 is held to a riser card holding member 9 in the embodiment. As illustrated in FIGS. 3 to 5, the riser card 8 has I/O component connectors 81A, 81B, and 81C, which are electrically connected to I/O components mounted on the tray member 6, and also has main-board connectors 82A and 82B, which are connected to connectors on the main board 5. The riser card 8 is shaped like an elongated strip; the main-board connectors 82A and 82B are disposed at one end of the riser card 8, the I/O component connector 81A is disposed at another end, and the I/O component connectors 81B and 81C are disposed near the center. The one end of the riser card 8 at which the main-board connectors 82A and 82B are disposed is formed as a wide part having a larger width than an area in which the I/O component connectors 81A, 81B, and 81C are disposed. The main-board connectors 82A and 82B are disposed at the lower end of the wide part of the riser card 8.

In the example illustrated in FIG. 3, the external terminals of the PCI card 71 are connected to the I/O component connector 81B of the riser card 8. The PCI card 71 is perpendicularly attached to the riser card 8 and is mounted on the tray member 6 in a state in which the tray bottom 61 placed on the tray bottom 61. The I/O component connector 81A may be, for example, a power supply connector. In this embodiment, the riser card 8 is an example of a connector board.

Next, the riser card holding member 9 will be described in detail with reference to FIG. 5. The riser card holding member 9 includes a long frame 91, which secures the riser card 8, and an inserting and removing mechanism 92 disposed at one end (specifically, the front end) of the frame 91.

The frame 91 is a metal sheet member having an L-shaped cross section. The inserting and removing mechanism 92 has a slit forming surface 92A, in which two alignment slits 10A and 10B are formed, and a lock piece 92B. The inserting and removing mechanism 92 will be described later in detail. In this embodiment, the riser card holding member 9 is an example of a connector board holding part.

Figure 6:
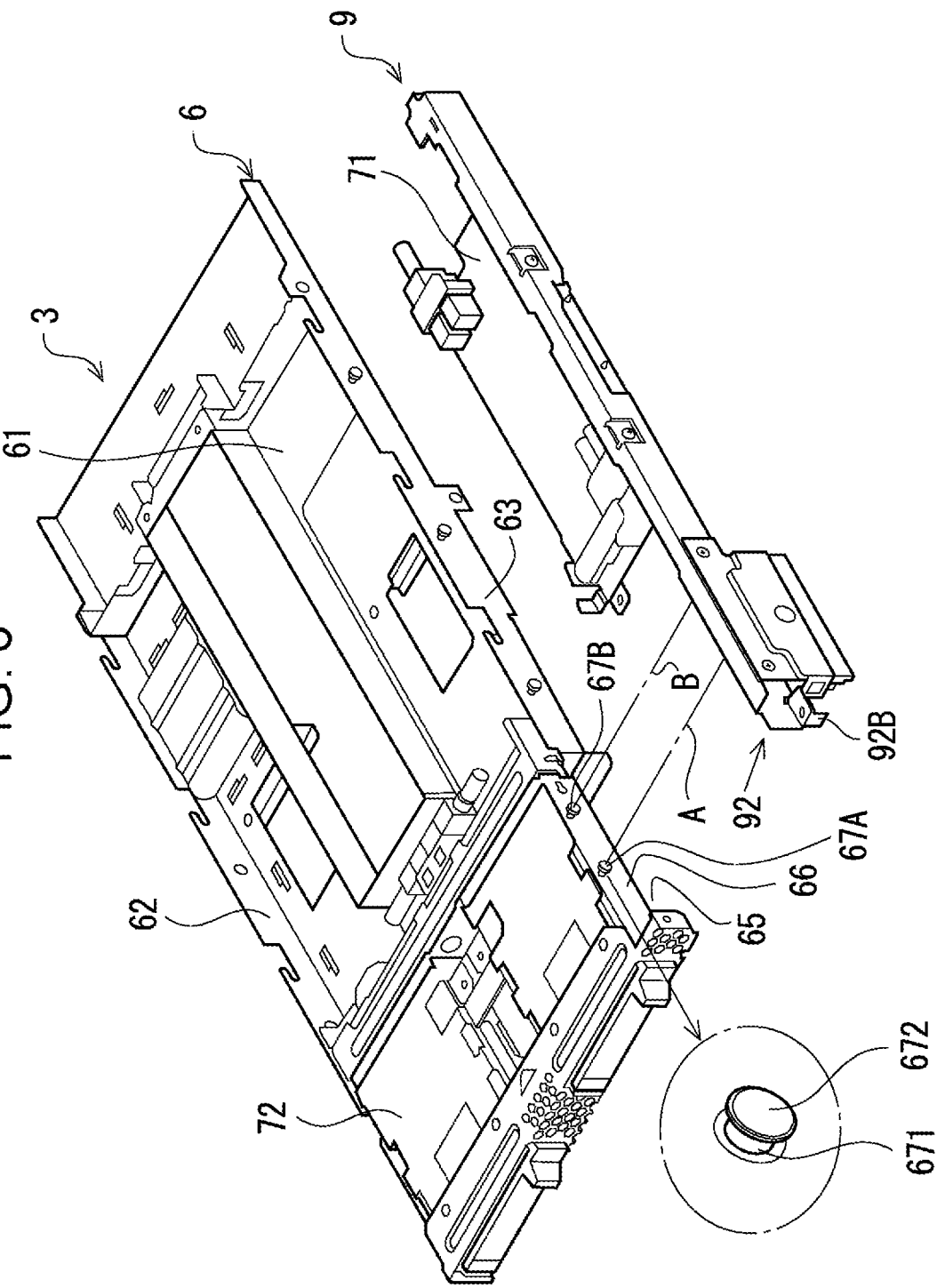
FIG. 6 illustrates the structure of a tray member, to which the riser card holding member is attached, in detail.

The riser card holding member 9 described above is attached to the tray member 6 in a state in which the riser card holding member 9 holds the riser card 8. The structure of the tray member 6, to which the riser card holding member 9 is attached, will be described in detail with reference to FIG. 6. As illustrated in FIG. 6, a notched opening 65 is formed at the front right corner of the tray bottom 61 of the tray member 6. An inserting and removing mechanism attaching wall 66 is erected perpendicularly in the upward direction from the tray bottom 61 along an edge of the opening 65. The inserting and removing mechanism attaching wall 66 is disposed in parallel to the tray right wall 63 at a position one step inside the tray right wall 63. As illustrated in FIG. 6, two guide pins 67A and 67B are provided on the inserting and removing mechanism attaching wall 66 at positions spaced by a predetermined distance so as to protrude. Each of the guide pins 67A and 67B has a columnar axis 671 connected to the inserting and removing mechanism attaching wall 66 and a discoid retainer 672 formed at the end of the axis 671.

As indicated by FIGS. 5 and 6, the guide pins 67A and 67B of the tray member 6 are accepted into the alignment slits 10A and 10B formed in the inserting and removing mechanism 92 (specifically, the slit forming surface 92A) of the riser card holding member 9 so as to be insertable and slidable. Each of the alignment slits 10A and 10B has a first slit 101 extending in the vertical direction of the slit forming surface 92A, a second slit 102 extending horizontally from the lower end of the first slit 101, and a third slit 103 communicating with an end of the second slit 102. The second slit 102 is formed along the direction in which the frame 91 extends. The first slit 101 and third slit 103 extend in a direction orthogonal to the second slit 102.

A circular insertion and removal part 104 is provided at the lower end of the third slit 103. The insertion and removal part 104 at the lower end of the third slit 103 has a larger diameter than the discoid retainers 672 for the guide pins 67A and 67B, enabling the guide pins 67A and 67B to be inserted into and removed from the relevant insertion and removal part 104. In the alignment slits 10A and 10B, the slit widths of portions other than the insertion and removal part 104 are smaller than the diameter of the retainer 672 of the guide pins 67A and 67B and is slightly larger than the diameter of the axis 671. Therefore, the guide pins 67A and 67B can be relatively slid along the alignment slits 10A and 10B without coming off the alignment slits 10A and 10B in portions other than the insertion and removal part 104. In this embodiment, the guide pin 67A of the tray member 6 is inserted into the alignment slit 10A in the riser card holding member 9, after which the guide pin 67B is inserted into the alignment slit 10B. Thus, the riser card holding member 9 is attached to the tray member 6. That is, the riser card 8 is attached to the tray member 6.

Figure 7:
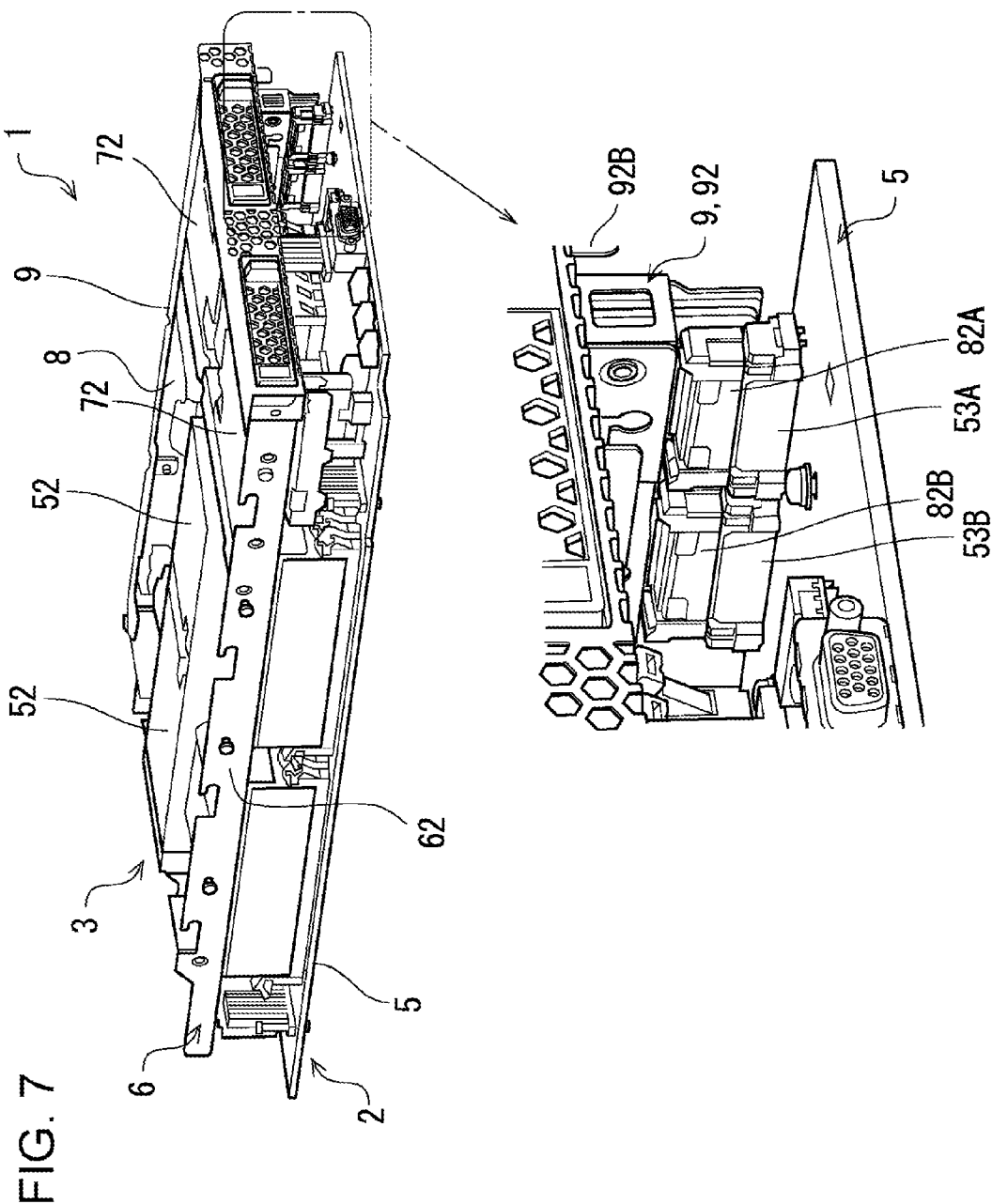
FIG. 7 illustrated the lower unit on which the upper unit is attached in the server apparatus in the embodiment, the lower unit being viewed through its chassis.

FIG. 7 illustrated the lower unit 2 on which the upper unit 3 is attached in the server apparatus 1 in the embodiment, the lower unit 2 being viewed through the chassis 4. In FIG. 7, the riser card holding member 9 has been attached to the upper unit 3. As illustrated in FIG. 7, main-board connectors 53A and 53B are provided on the main board 5. The main-board connectors 53A and 53B are electrically connected to the DIMM 51, the CPU, and other components mounted on the main board 5 through, for example, internal wires of the main board 5. In this embodiment, the main-board connectors 53A and 53B are each an example of an on-board connector.

After the lower unit 2 has been attached on the upper unit 3 and the riser card holding member 9 has been attached to the lower unit 2, the main-board connectors 82A and 82B are engaged with the main-board connectors 53A and 53B. This engagement of the main-board connectors 82A and 82B is achieved by passing at least an area in which the main-board connectors 82A and 82B are disposed, the area being part of the riser card 8 attached to the tray member 6 so as to be perpendicular to it, through the opening 65 in the tray bottom 61. That is, when the riser card 8 is passed through the tray bottom 61 and is disposed, the main-board connectors 82A and 82B can be engaged with the main-board connectors 53A and 53B and can be connected to them. As a result, the riser card 8 can be electrically connected to the main board 5. In this embodiment, the notched opening 65 in the tray bottom 61 is an example of a bottom opening. As a variation, when high-profile connectors are used as the main-board connectors 53A and 53B, the main-board connectors 82A and 82B on the riser card 8 may be provided at positions at which they do not pass through the opening 65. In either case, the opening 65 is preferably used.

Figure 8:
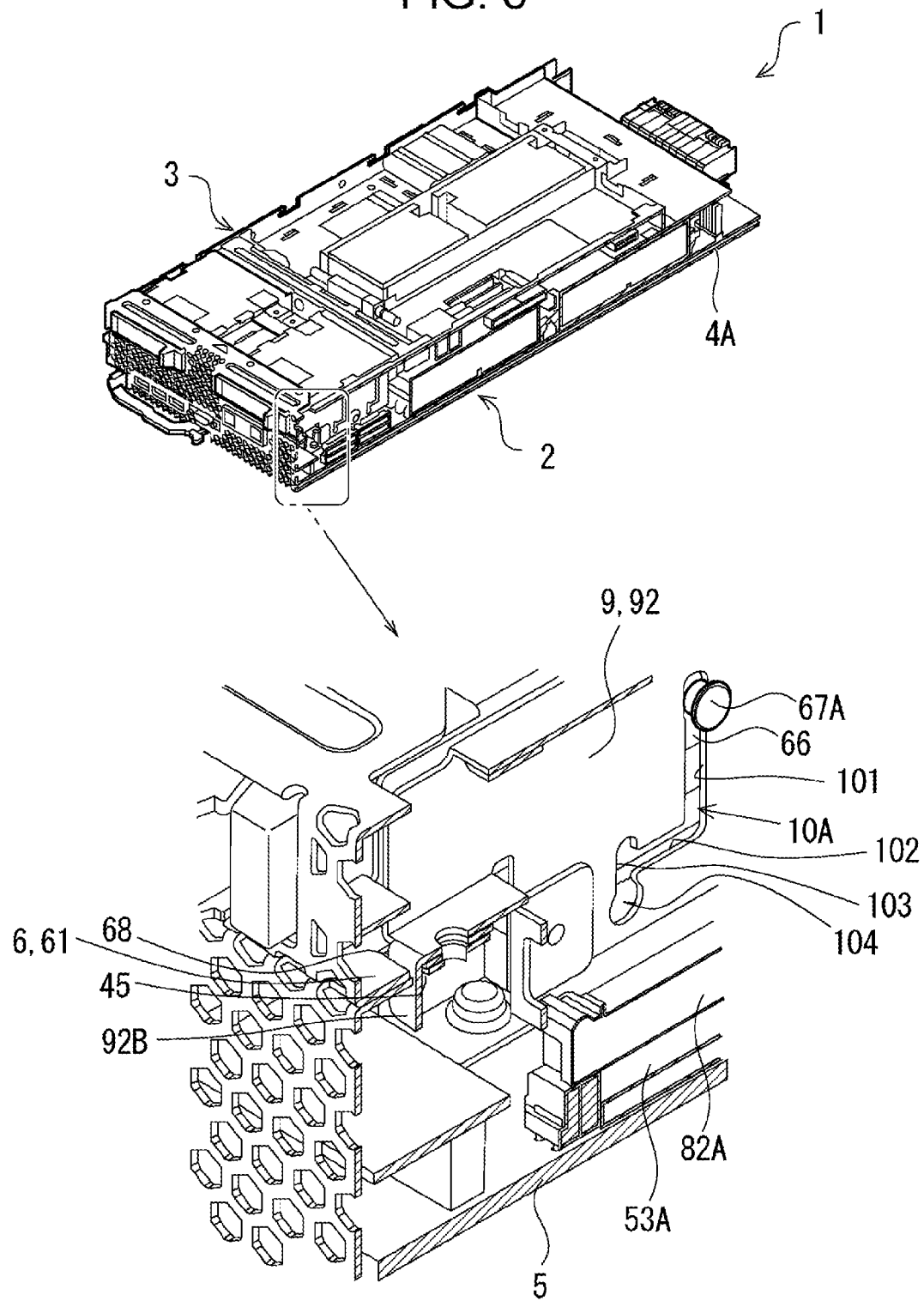
FIG. 8 illustrates the internal structure of the server apparatus in the embodiment.

FIG. 8 illustrates the internal structure of the server apparatus 1 in the embodiment. The server apparatus 1 in FIG. 8 is in a state in which the upper unit 3 has been attached on the lower unit 2 and the riser card holding member 9 has been attached to the lower unit 2, as in the state illustrated in FIG. 7. A tray-side engaging slit 68, which is essentially the same as the chassis-side engaging slit 45, is formed in the tray bottom 61 of the tray member 6 in the upper unit 3 so as to pass through the tray bottom 61. The tray-side engaging slit 68 is formed at the front of the server apparatus 1 as with the chassis-side engaging slit 45. The lock piece 92B provided as part of the inserting and removing mechanism 92 of the riser card holding member 9 can be inserted into the tray-side engaging slit 68 and chassis-side engaging slit 45.

Figure 9:
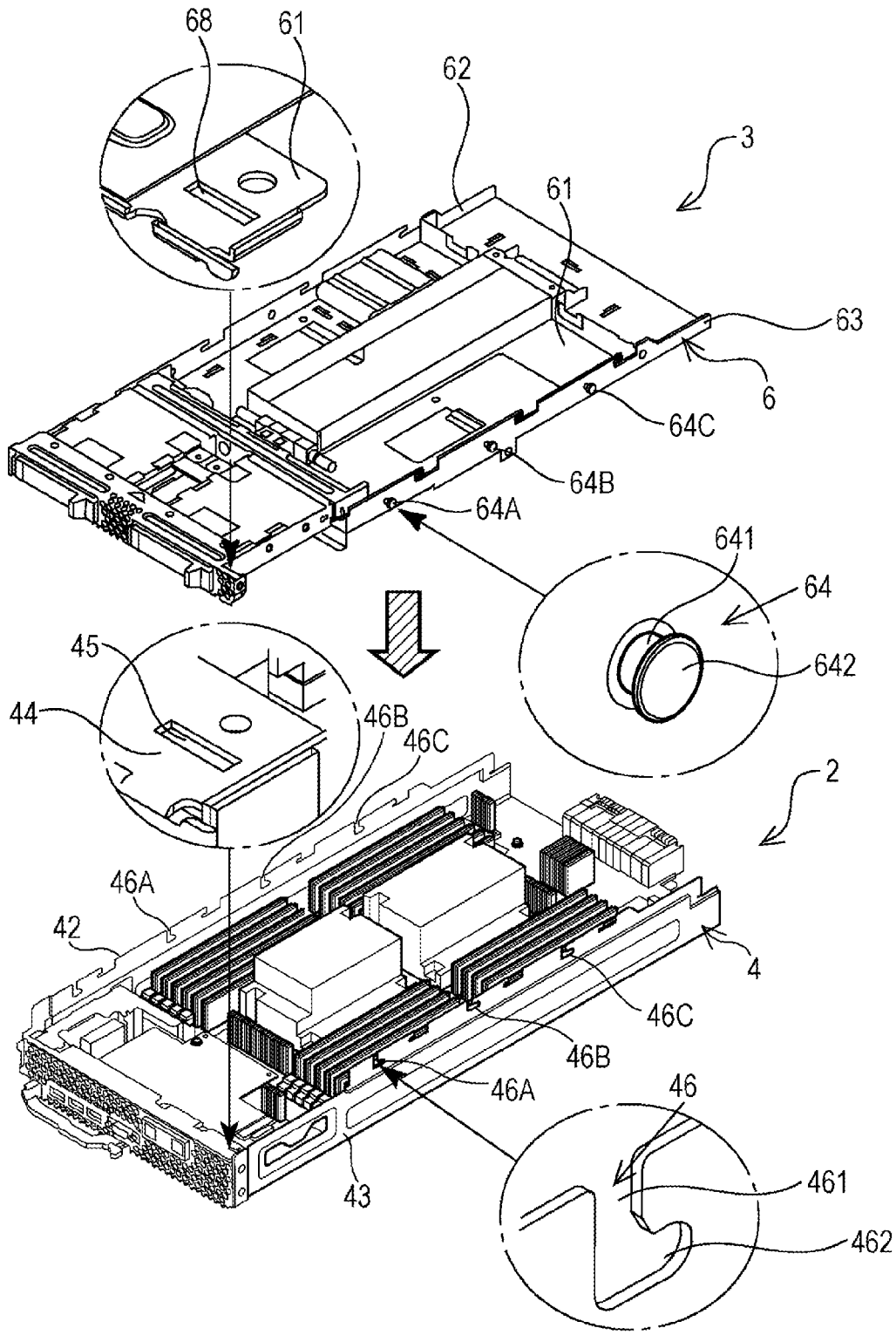
FIG. 9 illustrates a procedure for attaching and detaching the upper unit of the server apparatus in the embodiment to and from its lower unit.

Next, a procedure for attaching and detaching the upper unit 3 to and from the lower unit 2 in the server apparatus 1 and operations of individual parts will be described. First, the upper unit 3 is gripped and is brought close to the lower unit 2 from above as illustrated in FIG. 9. At that time, the riser card holding member 9 illustrated in FIG. 5 has not yet been attached to the tray member 6 of the upper unit 3.

FIG. 9 also illustrates details of the attachment and detachment slits 46A, 46B, and 46C, which will be collectively referred to below as the attachment and detachment slit 46, and the engaging pins 64A, 64B, and 64C, which will be collectively referred to below as the engaging pins 64, in an enlarged form. The engaging pin 64, which has substantially the same shape as the guide pins 67A and 67B described above, includes a columnar axis 641 and a discoid retainer 642 formed at the end of the axis 641. The attachment and detachment slit 46 formed in each of the left erected wall 42 and right erected wall 43 of the chassis 4 is L-shaped as described above. The attachment and detachment slit 46 includes a vertical slit 461 extending downward from the upper edge of the left erected wall 42 or right erected wall 43, whichever is applicable, toward the bottom of the chassis 4, and also includes a horizontal slit 462 extending from the lower end of the vertical slit 461 in a direction along the main board 5. The width of the attachment and detachment slit 46 is larger than the diameter of the axis 671 of the engaging pin 64 and is smaller than the diameter of the retainer 642.

The spacing between the engaging pins 64 on the tray left wall 62 and tray right wall 63 of the tray member 6 are the same as the spacing between the attachment and detachment slits 46 in the left erected wall 42 and right erected wall 43 of the chassis 4. The spacing between the left erected wall 42 and right erected wall 43 of the chassis 4 is slightly larger than the spacing between the external surfaces of the tray left wall 62 and tray right wall 63.

Figure 10A:
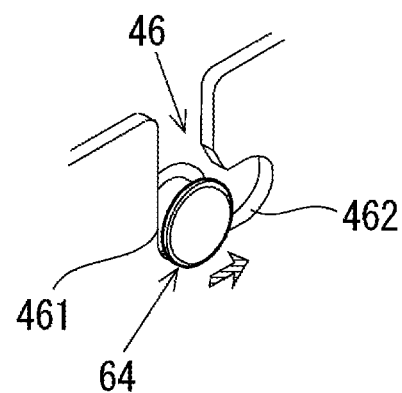
FIGS. 10A and 10B each illustrate the relative position of an engaging pin of a tray member, the relative position being in an attachment and detachment slit formed in a chassis.
Figure 10B:
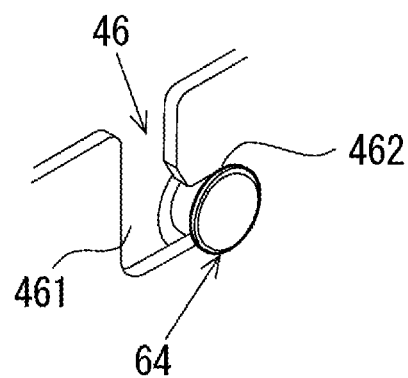

Then, each engaging pin 64 of the tray member 6 is aligned to its corresponding attachment and detachment slit 46 in the chassis 4 and the lower unit 2 is gradually lowered so that the engaging pin 64 is inserted from the vertical slit 461 into the attachment and detachment slit 46. FIGS. 10A and 10B each illustrate the relative position of the engaging pin 64 of the tray member 6, the relative position being in the attachment and detachment slit 46 formed in the chassis 4. FIG. 10A illustrate a state in which the relative position of the engaging pin 64 in the attachment and detachment slit 46 is a temporary holding position, and FIG. 10B illustrates a state in which the relative position of the engaging pin 64 in the attachment and detachment slit 46 is an engaged position.

Figure 11A:
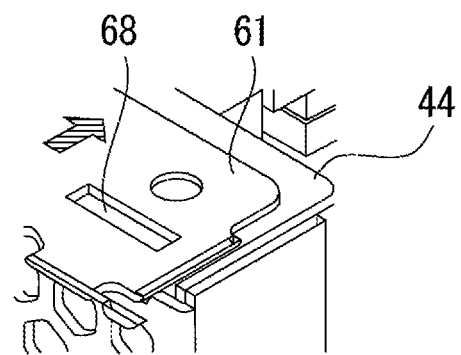
FIGS. 11A and 11B each illustrate the position of a tray-side engaging slit formed in the tray member, relative to the position of a chassis-side engaging slit in the chassis in the embodiment.

As illustrated in FIG. 10A, when the engaging pin 64 of the tray member 6 is slid to the bottom of the attachment and detachment slit 46 (specifically, the vertical slit 461) in the chassis 4 and reaches the temporary holding position, the height of the tray member 6 is positioned relative to the chassis 4. When the relative position of the engaging pin 64 in the attachment and detachment slit 46 is the temporary holding position, the planar position of the tray-side engaging slit 68 in the tray bottom 61 is misaligned with the planar position of the chassis-side engaging slit 45 in the chassis 4 in the fore-aft direction (see FIG. 11A).

Figure 11B:
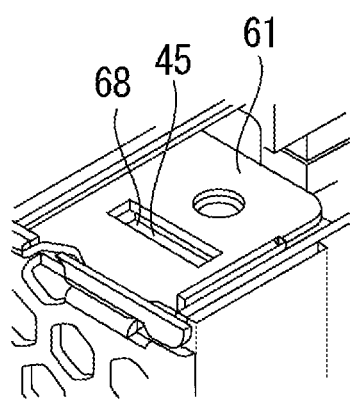

Next, in a state in which the relative position of the engaging pin 64 in the attachment and detachment slit 46 is the temporary holding position, the upper unit 3 (specifically, the tray member 6) is slid backward with respect to the lower unit 2 (specifically, the chassis 4). Then, the engaging pin 64 of the tray member 6 is slid along the horizontal slit 462 of the attachment and detachment slit 46 and is positioned at the end of the horizontal slit 462. As a result, the relative position of the engaging pin 64 in the attachment and detachment slit 46 changes to the engaged position as illustrated in FIG. 10B. In this state, the planar position of the tray-side engaging slit 68 is aligned with the planar position of the chassis-side engaging slit 45 as illustrated in FIG. 11B. That is, the chassis-side engaging slit 45 and tray-side engaging slit 68 exactly coincide vertically with each other.

Figure 12:
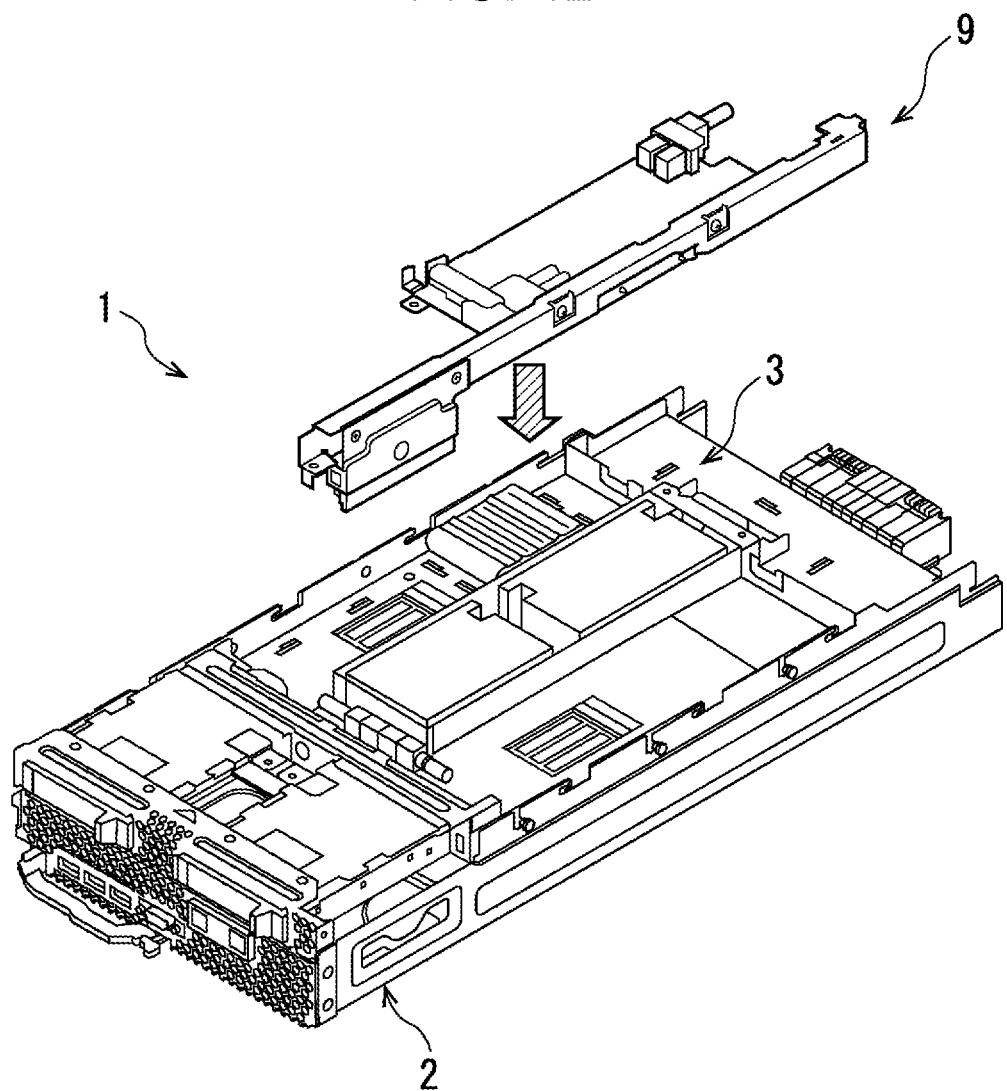
FIG. 12 illustrates a procedure for attaching the riser card holding member to the upper unit.

Next, a procedure for attaching the riser card holding member 9 to the upper unit 3 will be described. As illustrated in FIG. 12, the riser card holding member 9 to which the riser card 8 has been secured is brought close to the upper unit 3, which have been stacked on the lower unit 2 from above.

Then, the guide pins 67A and 67B on the tray member 6 are inserted from the insertion and removal parts 104 of the alignment slits 10A and 10B in the riser card holding member 9. The alignment slits 10A and 10B function as a guide mechanism in cooperation with the guide pins 67A and 67B, the guide mechanism selectively fitting and detaching the main-board connectors 82A and 82B to and from the main-board connectors 53A and 53B. The operation of the guide mechanism will be described below.

FIGS. 13A to 13G illustrate a procedure for manipulating the riser card holding member 9 as well as the relative positions of the guide pins 67A and 67B in alignment slits 10A and 10B, the relative positions corresponding to the manipulations of the riser card holding member 9. Although the lower unit 2 is not illustrated in FIGS. 13B, 13D and 13F, it will be assumed that the upper unit 3 has been attached on the lower unit 2 as described with reference to FIGS. 9, 10, 11A, and 11B. In FIGS. 13A, 13C, 13E, and 13G, the inserting and removing mechanism 92 (specifically, the slit forming surface 92A) is viewed through the riser card 8 held to the riser card holding member 9.

FIG. 13A illustrates a state in which the guide pins 67A and 67B have been inserted into the alignment slits 10A and 10B from the insertion and removal parts 104. The riser card holding member 9 is slightly lowered downward from this state, as indicated by the open arrow in FIG. 13B. The riser card holding member 9 then changes to the state illustrated in FIG. 13C. Specifically, the guide pins 67A and 67B slide along their respective third slits 103 and are positioned at the upper edges of the third slits 103. In other words, since the guide pins 67A and 67B are engaged with the upper edges of the third slits 103, the riser card holding member 9 is temporarily held to the upper unit 3 (specifically, the tray member 6). In this temporarily held state, even if, for example, the worker releases the hand from the riser card holding member 9, the riser card holding member 9 remains held in a stable attitude.

Next, the riser card holding member 9 is slid toward the front of the server apparatus 1, as indicated by the open arrow in FIG. 13D. The riser card holding member 9 then enters the state indicated by the open arrow in FIG. 13E. That is, the guide pins 67A and 67B move from the upper-end position of the third slit 103 to the second slit 102, and slide along the second slit 102. When the guide pins 67A and 67B slide to the boundary between the second slit 102 and the first slit 101, that is, to the lower-end position of the first slit 101, the guide pins 67A and 67B are positioned.

In this embodiment, an adjustment has been made so that when the guide pins 67A and 67B are positioned in the first slit 101, the planar position of the main-board connector 82A (82B) is aligned with the planar position of the main-board connector 53A (53B). More specifically, when the guide pins 67A and 67B are positioned in the third slit 103, the distance between the main-board connector 53A (53B) and the main-board connector 82A (82B) in the fore-aft direction of the server apparatus 1 is maximized. As the guide pins 67A and 67B slide along the second slit 102 in a direction toward the first slit 101, the distance between the main-board connector 53A (53B) and the main-board connector 82A (82B) in the fore-aft direction is gradually reduced. When the guide pins 67A and 67B reach the first slit 101, the distance between the main-board connector 53A (53B) and the main-board connector 82A (82B) in the fore-aft direction become zero, leading to a state in which the plane of the main-board connector 82A (82B) coincides with the plane of the main-board connector 53A (53B).

In this embodiment, in the state illustrated in FIG. 13E, that is, when the guide pins 67A and 67B are positioned at the lower end of the first slit 101, the main-board connector 82A (82B) is spaced apart from the main-board connector 53A (53B) in the vertical direction. Therefore, the riser card holding member 9 is then pressed downward, as indicated by the open arrow in FIG. 13F. As a result, the guide pins 67A and 67B slide from the lower-end position of the first slit 101 along the first slit 101 and is positioned at the upper-end position of the first slit 101. The first slit 101 extends in a direction orthogonal to the second slit 102. This suppresses a misalignment between the planar positions of the main-board connector 53A (53B) and main-board connector 82A (82B) when the guide pins 67A and 67B slide along the first slit 101. That is, when the guide pins 67A and 67B slide along the first slit 101, the distance between the main-board connector 53A (53B) and the main-board connector 82A (82B) is changed in a state in which the plane of the main-board connector 82A (82B) coincides with the plane of the main-board connector 53A (53B). As the guide pins 67A and 67B slide along the first slit 101, the vertical distance of the main-board connector 82A (82B) from the main-board connector 53A (53B) is gradually reduced.

The length of the first slit 101 is adjusted so that when the guide pins 67A and 67B reach the upper-end position of the first slit 101, the main-board connector 82A (82B) engage the main-board connector 53A (53B). This enables the riser card 8 to be electrically connected to the main board 5. At that time, the attachment of the upper unit 3 on the lower unit 2 is completed as illustrated in FIG. 1.

To separate the upper unit 3 from the lower unit 2, it suffices to reverse the procedure described above. That is, the riser card holding member 9 is pulled upward, after which the guide pins 67A and 67B are slid from the upper-end position of the first slit 101 toward its lower-end position. During the movement of the guide pins 67A and 67B to the lower end of the first slit 101, the fitting of the main-board connector 82A (82B) to the main-board connector 53A (53B) is released, and the main-board connector 82A (82B) is detached from the main-board connector 53A (53B). When the guide pins 67A and 67B are positioned at the lower end of the first slit 101, the main-board connector 82A (82B) are spaced from the main-board connector 53A (53B) in the vertical direction.

Next, the riser card holding member 9 is slid toward the back of the server apparatus 1. As a result, the guide pins 67A and 67B move from the lower end of the first slit 101 toward the second slit 102 and then slide along the second slit 102 toward the third slit 103. When the guide pins 67A and 67B are positioned at the upper-end position of the third slit 103, the riser card holding member 9 can be temporarily held to the upper unit 3. Accordingly, even if the worker releases the hand from the riser card holding member 9, the riser card holding member 9 remains held in a stable attitude. Therefore, the worker can easily remove the upper unit 3 from the lower unit 2 by, for example, holding the upper unit 3 with both hands and releasing the engagement between the attachment and detachment slits 46 and the engaging pins 64.

As described above, the server apparatus 1 has a structure in which the upper unit 3, in which I/O components are mounted, is detachably stacked on the lower unit 2, in which the main board 5 is mounted. In this embodiment, an area in which the main-board connectors 82A and 82B are disposed, the area being part of the riser card 8 attached to the tray member 6 so as to be perpendicular to it, is passed through the opening 65 in the tray bottom 61 so that the area can access the accommodating space in the lower unit 2. Since the riser card 8 is passed through the tray bottom 61 of the tray member 6 and is disposed, the main-board connectors 82A and 82B can be preferably connected to the main-board connectors 53A and 53B on the main board 5 mounted in the lower unit 2. Therefore, the main board 5 in the server apparatus 1 can lack a fixed area in which I/O components are mounted, an area in which an alignment mechanism that helps the attachment of I/O components is disposed, a work area used to attach and detach I/O components, and other areas. This enables the main board 5 to be made compact and thereby the server apparatus 1 (information processing apparatus) to be made compact and to have a high density.

Furthermore, the server apparatus 1 has a guide mechanism that is implemented by the cooperation of the alignment slits 10A and 10B in the riser card holding member 9 and the guide pins 67A and 67B of the tray member 6. If the guide mechanism is used during, for example, the maintenance and inspection of the server apparatus 1, when the upper unit 3 is to be removed from the lower unit 2, the main-board connector 82A (82B) can be easily disconnected from the main-board connector 53A (53B). When the maintenance and inspection of the server apparatus 1 is completed and the lower unit 2 is to be stacked on the upper unit 3, the main-board connector 82A (82B) can be precisely aligned with the main-board connector 53A (53B), so the main-board connector 82A (82B) can be easily fitted and connected to the main-board connector 53A (53B). Another advantage in this embodiment is that the guide mechanism described above can be implemented with a simple structure formed by the alignment slits 10A and 10B in the riser card holding member 9 and the guide pins 67A and 67B of the tray member 6, so cost-effectiveness is high. Since the riser card holding member 9 is structured so that it has two alignment slits 10A and 10B and that the guide pins 67A and 67B are respectively inserted into the alignment slits 10A and 10B, it is possible to stabilize the attitude of the riser card holding member 9 with respect to the tray member 6. It is also possible to suppress the guide pins 67A and 67B from coming off the alignment slits 10A and 10B unrestrictedly against the intention of the worker, enabling smooth alignment of the riser card 8 (specifically, the main-board connector 82A (82B)).

The alignment slits 10A and 10B in this embodiment are structured so that when the guide pins 67A and 67B are positioned in the first slit 101, the planar position of the main-board connector 82A (82B) is aligned with the planar position of the main-board connector 53A (53B). Furthermore, the first slit 101 is formed so as to extend in a direction in which the main-board connector 82A (82B) fits to the main-board connector 53A (53B). Therefore, the main-board connector 82A (82B) can be selectively fitted to and detached from the main-board connector 53A (53B) while the planar position of the main-board connector 82A (82B) is kept aligned with the planar positions of the main-board connector 53A (53B).

Furthermore, in the alignment slits 10A and 10B, the second slit 102 extends from the first slit 101 in a direction in which the planar position of the main-board connector 82A (82B) is displaced from the planar position of the main-board connector 53A (53B). Therefore, after fitting between the main-board connector 82A (82B) and the main-board connector 53A (53B) has been released, the upper unit 3 can be separated from the lower unit 2 with their planar positions being apart from each other. Therefore, during the maintenance and inspection of the server apparatus 1, it is possible to suppress the main-board connector 53A (53B) and main-board connector 82A (82B) from being brought into contact with each other and thereby from being damaged.

As illustrated in FIG. 9 and FIGS. 10A and 10B, in the server apparatus 1 in this embodiment, the attachment and detachment slit 46 in the chassis 4 is L-shaped and the engaging pin 64 of the tray member 6 is engaged with the attachment and detachment slit 46 so that the tray member 6 is detachably attached to the chassis 4. Therefore, the relative position of the engaging pin 64 in the attachment and detachment slit 46 can be easily switched between the temporarily held position and engaged position described above. When the relative position of the engaging pin 64 is the temporarily held position in the attachment and detachment slit 46, the tray member 6 can be temporarily held to the chassis 4 and can be easily removed from the chassis 4 by lifting the tray member 6. When the relative position of the engaging pin 64 is switched to the engaged position in the attachment and detachment slit 46, even if an external force is exerted in a direction in which the tray member 6 is moved away from the chassis 4, the engaging pin 64 is caught by the edge of the horizontal slit 462, causing a force resistant to the above external force. As a result, it is possible to suppress the upper unit 3 (specifically, the tray member 6) from unexpectedly coming off the lower unit 2 (specifically, the chassis 4).

The server apparatus 1 also has a lock mechanism that suppresses a relative misalignment between the lower unit 2 and the upper unit 3 in their planner direction in a state in which the main-board connector 82A (82B) of the riser card 8 is fitted to the main-board connector 53A (53B). This lock mechanism is implemented by including the chassis-side engaging slit 45, the tray-side engaging slit 68, and the lock piece 92B provided in the inserting and removing mechanism 92 of the riser card holding member 9.

As illustrated in FIGS. 10B and 11B, when the engaging pin 64 of the tray member 6 is positioned at the end of the horizontal slit 462 of the attachment and detachment slit 46, the planar position of the tray-side engaging slit 68 is aligned with the planar position of the chassis-side engaging slit 45. When the guide pins 67A and 67B of the tray member 6 are positioned at the lower end of the first slit 101 (see FIGS. 13E and 13G), the planar position of the lock piece 92B of the riser card holding member 9 is aligned with the planar positions of the chassis-side engaging slit 45 and tray-side engaging slit 68. Therefore, in the state illustrated in FIG. 13E, for example, that is, in the state in which the guide pins 67A and 67B are positioned at the lower end of the first slit 101, all of the planes of the chassis-side engaging slit 45, tray-side engaging slit 68, and lock piece 92B coincide with one another as illustrated in FIG. 14.

Figure 14:
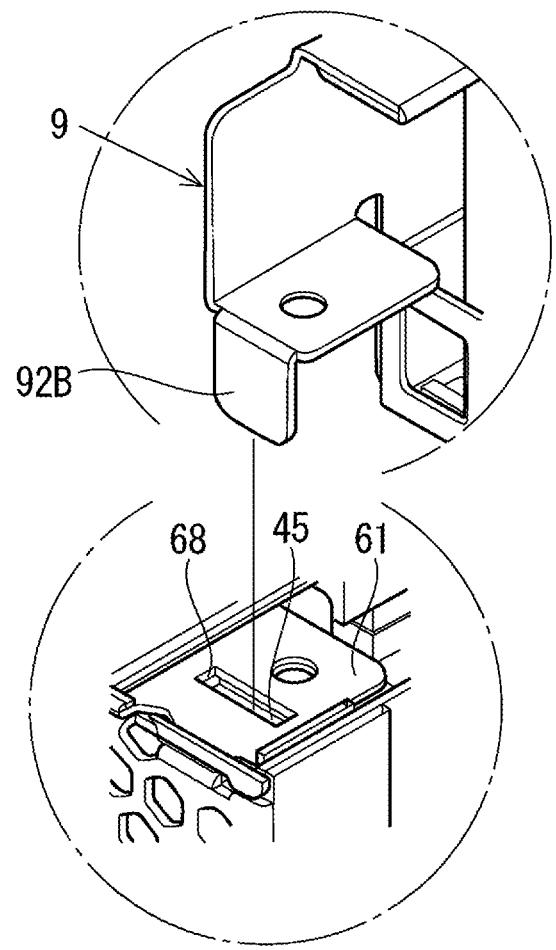
FIG. 14 illustrates a state in which the planes of the chassis-side engaging slit, the tray-side engaging slit, and a lock piece coincide with one another.

FIG. 14 illustrates a state in which the planes of the chassis-side engaging slit 45, tray-side engaging slit 68, and lock piece 92B coincide with one another. When the lower unit 2 is attached on the upper unit 3 as illustrated in FIGS. 13F and 13G, the main-board connector 82A (82B) is fitted to the main-board connector 53A (53B) by pressing the riser card holding member 9 downward. At that time, all of the planes of the chassis-side engaging slit 45, tray-side engaging slit 68, and lock piece 92B coincide with one another as illustrated in FIG. 14, the lock piece 92B can be inserted into both the chassis-side engaging slit 45 and the tray-side engaging slit 68. That is, in this embodiment, the lock piece 92B can be inserted into both the chassis-side engaging slit 45 and tray-side engaging slit 68 when the main-board connector 82A (82B) is fitted to the main-board connector 53A (53B).

In a state in which the lock piece 92B is inserted into both the chassis-side engaging slit 45 and tray-side engaging slit 68, a misalignment between the chassis 4 and the tray member 6 is suppressed in their planar direction. Therefore, while the main-board connector 82A (82B) is fitted to the main-board connector 53A (53B), a misalignment between the chassis 4 and the tray member 6 can be suppressed in their planar direction. Accordingly, in a state in which the main-board connector 82A (82B) is fitted to the main-board connector 53A (53B), it is possible to suppress the engaging pins 64 of the tray member 6 from unexpectedly moving from the engaged position to the temporarily held position. That is, even if an external force is applied to the upper unit 3 or lower unit 2 in a state in which the main-board connector 82A (82B) is fitted to the main-board connector 53A (53B), it is possible to suppress the tray member 6 from being detached from the chassis 4.

When the main-board connector 82A (82B) is detached from the main-board connector 53A (53B) by manipulating the riser card holding member 9, the lock piece 92B is pulled out from the chassis-side engaging slit 45 and tray-side engaging slit 68 in response to the detachment. As a result, the chassis 4 and tray member 6 are allowed to be relatively misaligned in their planar direction. Accordingly, the engaging pins 64 of the tray member 6 can be moved from the engaged position to the temporarily held position, enabling the tray member 6 from being removed from the chassis 4.

So far, the server apparatus 1 (information processing apparatus) in the present disclosure has been described according to an embodiment. However, the present disclosure is not limited to the above description. It will be understood by those skilled in the art that the above embodiment can be modified, improved, and combined in various ways.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
a lower unit that has a circuit board on which one or a plurality of first electronic components are mounted and also has a chassis in which the circuit board is mounted at a bottom, an upper surface of the chassis being open; and
an upper unit that has a tray member detachably attached to the chassis and also has one or a plurality of second electronic components mounted at a bottom of the tray member, the upper unit being stacked on the lower unit; wherein
the upper unit has a connector board attached to the tray member, the connector board having a first connector and a second connector, the first connector being fitted to a board-side connector provided on the circuit board, the second connector being electrically connected to the second electronic components, and
an opening is formed at the bottom of the tray member, the first connector and the board-side connector being mutually fitted through the opening,
wherein the apparatus further comprises:
a connector board holding part that holds the connector board, the connector board holding part being detachably attached to a side surface of the tray member; and
a guide mechanism that guides the connector board holding part attached to the tray member and selectively fits and detaches the first connector to and from the board-side connector,
wherein the guide mechanism includes a guide pin formed on a side surface of the upper unit and also includes an alignment slit formed in the connector board holding part, the alignment slit accepting the guide pin so as to be removable and slidable.

2. The information processing apparatus according to claim 1, wherein:
the alignment slit includes a first slit extending in a direction in which the first connector is fitted to the board-side connector and also includes a second slit extending from the first slit part in a direction in which a misalignment occurs between a planar position of the board-side connector and a planar position of the first connector; and
the planar position of the board-side connector and the planar position of the first connector are aligned with each other in a state in which the guide pin is positioned in the first slit.

3. The information processing apparatus according to claim 1, wherein:
a flange is provided so as to protrude from the erected wall erected from the bottom of the chassis toward an inside of the chassis, a first through-hole being formed in the flange;
a second through-hole is formed in the bottom of the tray member, the second through-hole coinciding with the first through-hole in a state in which the engaging pin is positioned at an end of the horizontal slit;
the connector board holding part has a lock piece that is insertable into the first through-hole and the second through-hole; and
the lock piece is inserted into both the first through-hole and the second through-hole when the first connector is fitted to the board-side connector, and is pulled out from the first through-hole and the second through-hole when the first connector is detached from the board-side connector.

4. The information processing apparatus according to claim 1, further comprising a lock mechanism that suppresses a relative misalignment between the lower unit and the upper unit in a planar direction of the lower unit and the upper unit in a state in which the first connector is fitted to the board-side connector.

5. An information processing apparatus comprising:
a lower unit that has a circuit board on which one or a plurality of first electronic components are mounted and also has a chassis in which the circuit board is mounted at a bottom, an upper surface of the chassis being open; and
an upper unit that has a tray member detachably attached to the chassis and also has one or a plurality of second electronic components mounted at a bottom of the tray member, the upper unit being stacked on the lower unit; wherein
the upper unit has a connector board attached to the tray member, the connector board having a first connector and a second connector, the first connector being fitted to a board-side connector provided on the circuit board, the second connector being electrically connected to the second electronic components,
an opening is formed at the bottom of the tray member, the first connector and the board-side connector being mutually fitted through the opening,
an attachment and detachment slit is formed in an erected wall erected from the bottom of the chassis, the tray member being attached to and detached from the chassis by inserting and removing an engaging pin into and from the attachment and detachment slit, the engaging pin protruding from an external surface of a tray side wall erected from the bottom of the tray member, and
the attachment and detachment slit includes a vertical slit extending downward from an upper edge of the erected wall of the chassis toward the bottom of the chassis and also includes a horizontal slit part extending from a lower end of the vertical slit in a direction along the circuit board.

6. The information processing apparatus according to claim 5, further comprising:
a connector board holding part that holds the connector board, the connector board holding part being detachably attached to a side surface of the tray member; and
a guide mechanism that guides the connector board holding part attached to the tray member and selectively fits and detaches the first connector to and from the board-side connector.

7. The information processing apparatus according to claim 6, wherein the guide mechanism includes a guide pin formed on a side surface of the upper unit and also includes an alignment slit formed in the connector board holding part, the alignment slit accepting the guide pin so as to be removable and relatively slidable.

8. The information processing apparatus according to claim 7, wherein:
the alignment slit includes a first slit extending in a direction in which the first connector is fitted to the board-side connector and also includes a second slit extending from the first slit part in a direction in which a misalignment occurs between a planar position of the board-side connector and a planar position of the first connector; and
the planar position of the board-side connector and the planar position of the first connector are aligned with each other in a state in which the guide pin is positioned in the first slit.

9. The information processing apparatus according to claim 5, wherein:
a flange is provided so as to protrude from the erected wall erected from the bottom of the chassis toward an inside of the chassis, a first through-hole being formed in the flange;
a second through-hole is formed in the bottom of the tray member, the second through-hole coinciding with the first through-hole in a state in which the engaging pin is positioned at an end of the horizontal slit;
the connector board holding part has a lock piece that is insertable into the first through-hole and the second through-hole; and
the lock piece is inserted into both the first through-hole and the second through-hole when the first connector is fitted to the board-side connector, and is pulled out from the first through-hole and the second through-hole when the first connector is detached from the board-side connector.

10. The information processing apparatus according to claim 5, further comprising a lock mechanism that suppresses a relative misalignment between the lower unit and the upper unit in a planar direction of the lower unit and the upper unit in a state in which the first connector is fitted to the board-side connector.

* * * * *